United States Patent
Jung et al.

(10) Patent No.: US 12,374,531 B2
(45) Date of Patent: Jul. 29, 2025

(54) PLASMA PROCESSING APPARATUS

(71) Applicant: TOKYO ELECTRON LIMITED, Tokyo (JP)

(72) Inventors: Hwajun Jung, Gyeonggi-do (KR); Mitsunori Ohata, Miyagi (JP); Yuki Hosaka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 213 days.

(21) Appl. No.: 17/485,318

(22) Filed: Sep. 24, 2021

(65) Prior Publication Data
US 2022/0102119 A1 Mar. 31, 2022

(30) Foreign Application Priority Data

Sep. 25, 2020 (JP) .................................. 2020-161377
May 13, 2021 (JP) .................................. 2021-081751

(51) Int. Cl.
*H01J 37/32* (2006.01)
*C23C 16/458* (2006.01)
*H01L 21/687* (2006.01)

(52) U.S. Cl.
CPC .... *H01J 37/32669* (2013.01); *C23C 16/4585* (2013.01); *C23C 16/4586* (2013.01);
(Continued)

(58) Field of Classification Search
CPC .. H01J 37/321; H01J 37/3211; H01J 37/3266; H01J 37/32568; H01J 37/32669;
(Continued)

(56) References Cited

U.S. PATENT DOCUMENTS 5,444,207 A * 8/1995 Sekine ................ H01J 37/3266
156/345.46
6,030,486 A * 2/2000 Loewenhardt ........ H01J 37/321
156/345.46
(Continued)

FOREIGN PATENT DOCUMENTS

JP 2003-514386 A 4/2003
JP 2018-98094 A 6/2018

*Primary Examiner* — Kurt Sweely
(74) *Attorney, Agent, or Firm* — XSENSUS LLP (57) ABSTRACT

A plasma processing apparatus comprising a processing chamber, a dielectric, an antenna, and a first to third electromagnet groups is disclosed. In the processing chamber, a mounting table having a mounting surface is included and a plasma process is performed. A surface of the dielectric faces the mounting surface. The antenna, provided on the opposite surface of the dielectric, introduces an electric field into the processing table through the dielectric to form plasma. The first electromagnet group, provided at a position higher than the mounting surface on an outer perimeter of the processing chamber, forms a first magnetic field above the mounting surface. The second electromagnet group, provided inside the mounting table along an outer perimeter thereof, and the third electromagnet group, provided at a position corresponding to the second electromagnet group on the outer perimeter of the processing chamber, cooperate with each other to form a second magnetic field around the mounting surface.

16 Claims, 7 Drawing Sheets

(52) U.S. Cl.
CPC ..... *H01J 37/3211* (2013.01); *H01J 37/32366* (2013.01); *H01J 37/321* (2013.01); *H01J 37/32568* (2013.01); *H01J 37/32715* (2013.01); *H01L 21/68785* (2013.01)

(58) Field of Classification Search
CPC .......... H01J 37/32688; H01J 37/32715; C23C 16/4585; C23C 16/4586; H01L 21/68785
See application file for complete search history.

(56) References Cited

U.S. PATENT DOCUMENTS

| | | | | |
|---|---|---|---|---|
| 6,113,731 | A * | 9/2000 | Shan | H01L 21/67069 156/345.46 |
| 6,322,661 | B1 * | 11/2001 | Bailey, III | H01J 37/32688 204/298.37 |
| 6,562,189 | B1 * | 5/2003 | Quiles | H01J 37/32871 156/345.43 |
| 2003/0192857 | A1 * | 10/2003 | Masuda | H01J 37/32623 156/345.46 |
| 2011/0056912 | A1 * | 3/2011 | Matsuyama | H01J 37/32623 427/571 |
| 2012/0097870 | A1 | 4/2012 | Leray et al. | |
| 2012/0190207 | A1 * | 7/2012 | Nishimura | H01J 37/32422 156/345.35 |
| 2017/0040170 | A1 * | 2/2017 | Guha | H01L 21/67069 |
| 2018/0174806 | A1 * | 6/2018 | Nagaseki | H01L 21/67069 |

\* cited by examiner

PLASMA PROCESSING APPARATUS

CROSS-REFERENCE TO RELATED APPLICATIONS

This application claims priority to and the benefit of Japanese Patent Application Nos. 2020-161377 and 2021-081751 filed on Sep. 25, 2020 and May 13, 2021, respectively, the entire contents of which are incorporated herein by reference.

TECHNICAL FIELD

The present disclosure relates to a plasma processing apparatus.

BACKGROUND

There are plasma processing apparatuses that perform a plasma process on an object to be processed, such as a semiconductor wafer, using the excitation of plasma generated by an induced electric field. Such a plasma processing apparatus is referred to as an inductively coupled plasma processing apparatus.

Japanese Patent Application Publication No. 2018-98094 discloses an inductively coupled plasma processing apparatus in which an electromagnet group is provided along an outer perimeter of a processing chamber for accommodating an object to be processed, and a magnetic field is formed in the processing chamber to traverse or surround plasma, thereby suppressing the amount of ions that reach the object to be processed.

SUMMARY

The present disclosure provides a technology capable of independently controlling a ratio of ions to radicals at each of a central portion and an edge portion of an object to be processed.

A plasma processing apparatus is provided. The apparatus comprises a processing chamber including a mounting table having a mounting surface, wherein an object to be processed is mounted on the mounting surface and a plasma process is performed on the object to be processed in the processing chamber; a dielectric which has a surface facing the mounting surface of the mounting table; an antenna which is provided on a surface opposite to the facing surface of the dielectric and introduces an induced electric field into the processing table through the dielectric to form plasma; a first electromagnet group which is provided at a position higher than the mounting surface of the mounting table on an outer perimeter of the processing chamber and forms a first magnetic field that traverses the processing chamber above the mounting surface of the mounting table; a second electromagnet group provided inside the mounting table along an outer perimeter of the mounting table; and a third electromagnet group which is provided at a position corresponding to the second electromagnet group on the outer perimeter of the processing chamber and cooperates with the second electromagnet group to form a second magnetic field around the mounting surface of the mounting table.

DETAILED DESCRIPTION

Hereinafter, embodiments of a plasma processing apparatus disclosed in the present application will be described in detail with reference to the accompanying drawings. In addition, the same or corresponding parts will be denoted with the same reference numerals in each drawing. Furthermore, the processing apparatus to be disclosed is not limited by the present embodiment.

In an inductively coupled plasma processing apparatus in which an electromagnet group is provided along an outer perimeter of a processing chamber, there is room for improvement in that a ratio of ions to radicals at each of a central portion and an edge portion of an object to be processed is controlled independently.

Therefore, it is desirable to independently control the ratio of ions to radicals at each of the central portion and the edge portion of the object to be treated.

Configuration Example of Plasma Processing Apparatus

Figure 1:
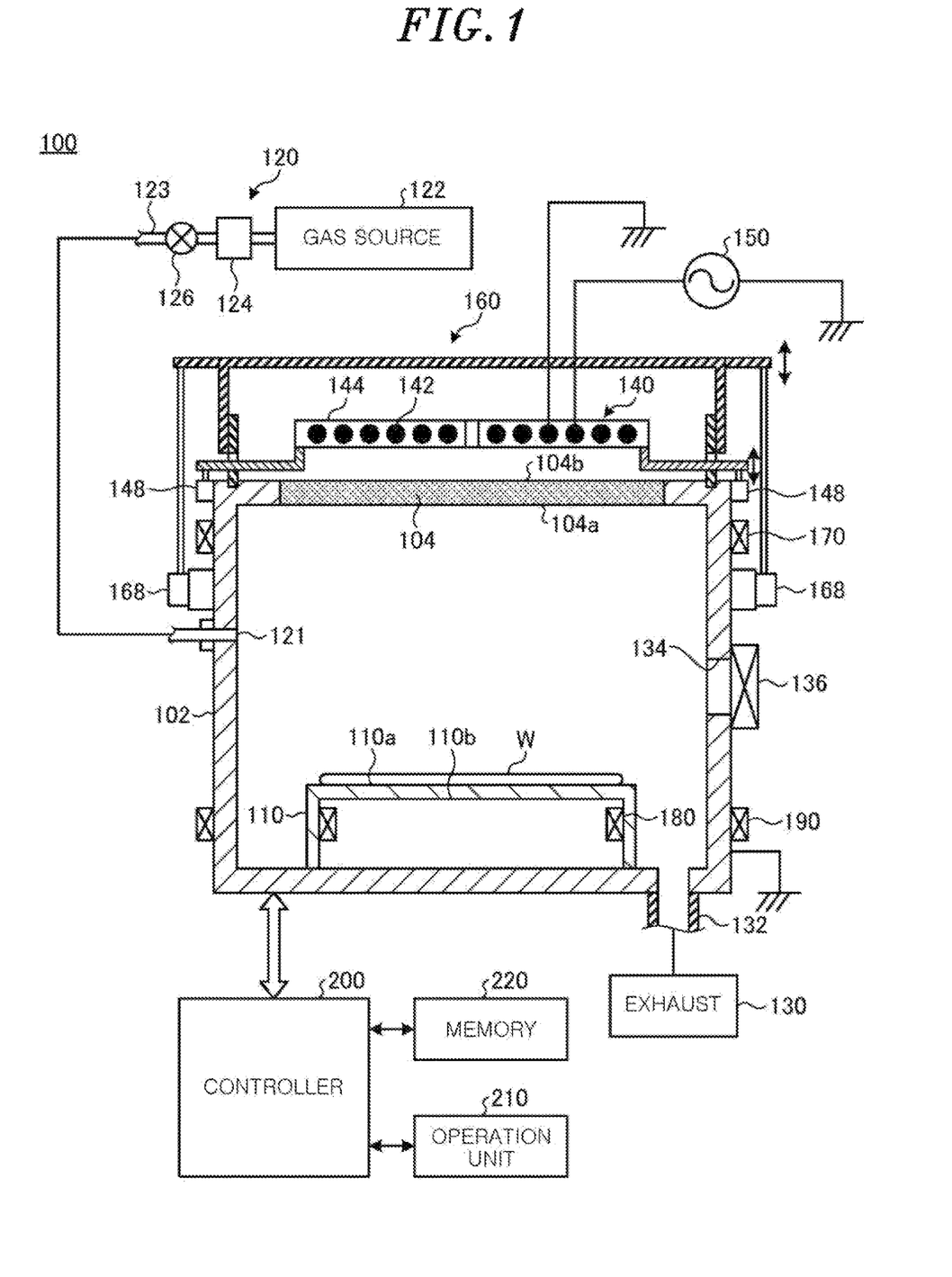
FIG. 1 is a schematic cross-sectional view illustrating a configuration of a plasma processing apparatus according to the present embodiment.

First, a configuration example of a plasma processing apparatus 100 according to the present embodiment will be described with reference to the drawings. Here, an example of an inductively coupled plasma processing apparatus is presented, in which a predetermined plasma process is performed on a semiconductor wafer (hereinafter, also simply referred to as "wafer") W as an object to be processed, using plasma of a processing gas excited in a processing chamber by applying high-frequency power to a high-frequency antenna having a planar shape. FIG. 1 is a schematic cross-sectional view illustrating a configuration of the plasma processing apparatus 100 according to the present embodiment.

As shown in FIG. 1, the plasma processing apparatus 100 includes a processing chamber 102 formed in a tubular shape (for example, a cylindrical shape) made of a metal (for example, aluminum). The shape of the processing chamber 102 is not limited to the cylindrical shape. For example, the shape of the processing chamber 102 may be any angular tube shape (for example, a box shape).

A mounting table 110 for mounting the wafer W is provided on the bottom portion of the processing chamber 102. The mounting table 110 is formed of aluminum or the like to have an approximately columnar shape (for example, a cylindrical shape). The upper surface of the mounting table 110 is a mounting surface 110a on which the wafer W is mounted. In addition, the shape of the mounting table 110 is not limited to the cylindrical shape. For example, the shape of the mounting table 110 may be a prismatic shape (for example, a polygonal columnar shape). Although not shown, if necessary, the mounting table 110 may be provided with various functions of an electrostatic chuck configured to attract and hold the wafer W through a Coulomb force, a temperature adjusting mechanism such as a heater or a refrigerant flow channel, and the like.

A plate-shaped dielectric 104 made of, for example, quartz glass or ceramic, is provided on the ceiling of the processing chamber 102 so as to face the mounting table 110. Specifically, the dielectric 104 is formed in, for example, a disk shape and is airtightly installed to close an opening formed in the ceiling of the processing chamber 102. The dielectric 104 has a facing surface 104a facing the mounting surface 110a of the mounting table 110.

The processing chamber 102 is provided with a gas supply unit 120 for supplying a processing gas or the like for processing the wafer W. For example, the gas supply unit 120 is formed as shown in FIG. 1. That is, a gas inlet 121 is formed in a sidewall of the processing chamber 102, and a gas source 122 is connected to the gas inlet 121 through a gas supply pipe 123. A flow rate controller for controlling the flow rate of a processing gas, for example, a mass flow controller (MFC) 124 and an on-off valve 126, is disposed in the middle of the gas supply pipe 123. In the gas supply unit 120, a processing gas from the gas source 122 is controlled at a predetermined flow rate by the MFC 124 and supplied into the processing chamber 102 from the gas inlet 121.

In FIG. 1, in order to simplify the description, the gas supply unit 120 is illustrated as being a single gas line, but the gas supply unit 120 is not limited to the case of supplying a single type of processing gas. A plurality of types of gases may be supplied as processing gases. In this case, a plurality of gas sources may be provided to constitute a plurality of gas lines, and an MFC may be provided in each gas line. In addition, in FIG. 1, an example case in which the gas supply unit 120 is configured to supply a gas from the sidewall of the processing chamber 102 is given, but the present disclosure is not necessarily limited thereto. For example, the gas supply unit 120 may be configured to supply a gas from the ceiling of the processing chamber 102. In this case, for example, a gas inlet may be formed in a central portion of the dielectric 104, and a gas may be supplied from the gas inlet.

As a processing gas supplied into the processing chamber 102 by the gas supply unit 120, for example, when an oxide film is etched, a fluorocarbon-based gas including carbon (C) and fluorine (F) is used. Specifically, when a silicon oxide film such as a $SiO_2$ film is etched, $CHF_3$ gas or the like is used as a processing gas. Furthermore, when a high dielectric thin film such as an $HfO_2$, $HfSiO_2$, $ZrO_2$, or $ZrSiO_4$ film is etched, $BCl_3$ gas may be used as a processing gas, or a mixed gas of a $BCl_3$ gas and an $O_2$ gas may be used as a processing gas.

An exhaust 130 for exhausting an atmosphere inside the processing chamber 102 is connected to the bottom of the processing chamber 102 through an exhaust pipe 132. The exhaust 130 may include, for example, a vacuum pump to depressurize the inside of the processing chamber 102 to a predetermined pressure. A wafer loading/unloading port 134 is formed in a sidewall of the processing chamber 102, and a gate valve 136 is provided on the wafer loading/unloading port 134. For example, when a wafer W is loaded, the gate valve 136 is opened and the wafer W is mounted on the mounting table 110 in the processing chamber 102 using a transfer mechanism such as a transfer arm (not shown), and then, the gate valve 136 is closed to process the wafer W.

A high-frequency antenna 140 having a planar shape is disposed on a surface 104b opposite to the facing surface 104a of the dielectric 104. The high-frequency antenna 140 introduces an induced electric field for plasma excitation into the processing chamber 102 through the dielectric 104. In the high-frequency antenna 140, for example, spiral antenna elements 142 made of a conductor, such as copper, aluminum, or stainless steel, is held by a plurality of holding bodies 144.

A high-frequency power supply 150 is connected to the antenna element 142. The high-frequency power supply 150 supplies high-frequency power having a predetermined frequency (for example, 27.12 MHz) to the antenna element 142. An induced electric field is introduced into the processing chamber 102 through the dielectric 104 by the antenna element 142 to which the high-frequency power is supplied. A gas introduced into the processing chamber 102 is excited due to the induced electric field introduced into the processing chamber 102 to generate plasma. As a result, predetermined plasma processes, such as an asking process, an etching process, and a film forming process, are performed on the wafer W. The high-frequency power output from the high-frequency power supply 150 is not limited to 27.12 MHz. For example, the high-frequency power may have a frequency of 13.56 MHz, 60 MHz, or the like. However, it is necessary to adjust an electrical length of the antenna element 142 according to the high-frequency power output from the high-frequency power supply 150.

In addition, the height of the high-frequency antenna 140 may be adjusted by an actuator 148.

A shield member 160 having an approximately tubular shape (for example, a cylindrical shape) is provided on the ceiling of the processing chamber 102 so as to cover the high-frequency antenna 140. The shape of the shield member 160 is not limited to the cylindrical shape. The shape of the shield member 160 may be, for example, another shape such as an angular tube shape, but it is preferable that the shape of the shield member 160 matches the shape of the processing chamber 102. Here, for example, since the processing chamber 102 has an approximately cylindrical shape, the shield member 160 is also formed in an approximately cylindrical shape. In addition, when the processing chamber 102 has an approximately angular tube shape, it is preferable that the shield member 160 also has an approximately angular tube shape. Furthermore, the height of the shield member 160 may be adjusted by an actuator 168.

A first electromagnet group 170 is provided on an outer perimeter of the processing chamber 102. For example, on an outer surface of the sidewall of the processing chamber 102, the first electromagnet group 170 is provided in a concentric shape about a central axis of the processing chamber 102 and the mounting table 110. The first electromagnet group 170 is provided on the outer surface of the sidewall of the processing chamber 102 so as to be positioned at a higher level than the mounting surface 110a of the mounting table 110. The first electromagnet group 170 forms a magnetic field that traverses plasma above the mounting surface 110a of the mounting table 110. The configuration of the first electromagnet group 170 will be described below.

A second electromagnet group 180 is provided inside the mounting table 110 in the processing chamber 102. In the present embodiment, an internal space 110b is formed in the mounting table 110 so as to have a hollow shape that is not exposed inside the processing chamber 102. The second electromagnet group 180 is provided on an inner wall surface of the internal space 110b along an outer perimeter of the mounting table 110. For example, on the inner wall surface of the internal space 110b, the second electromagnet group 180 is provided in a concentric shape about the central axis of the processing chamber 102 and the mounting table 110. The second electromagnet group 180 is provided inside the mounting table 110 (that is, on the inner wall surface of the internal space 110b) and thus is disposed at a position at a lower level than the mounting surface 110a of the mounting table 110.

A third electromagnet group 190 is provided on the outer perimeter of the processing chamber 102. For example, on the outer surface of the sidewall of the processing chamber 102, the third electromagnet group 190 is provided in a concentric shape about the central axis of the processing chamber 102 and the mounting table 110. The third electromagnet group 190 is provided on the outer surface of the sidewall of the processing chamber 102 so as to be at a position corresponding to the second electromagnet group 180. In the present embodiment, the third electromagnet group 190 is provided on the outer surface of the sidewall of the processing chamber 102 so as to be positioned at the same height position as that of the second electromagnet group 180. In addition, the third electromagnet group 190 may be provided at a height position higher than as the height position of the second electromagnet group 180. The third electromagnet group 190 cooperates with the second electromagnet group 180 to form a magnetic field around the mounting surface 110a of the mounting table. The configurations of the second electromagnet group 180 and the third electromagnet group 190 will be described below.

A controller 200 including a central processing unit (CPU) is connected to the plasma processing apparatus 100, and each unit of the plasma processing apparatus 100 is controlled by the controller 200. Furthermore, an operation unit 210 is connected to the controller 200, wherein the operation unit 210 is provided as a keyboard through which an operator inputs commands or the like for managing the plasma processing apparatus 100, a display which visualizes and displays an operating status of the plasma processing apparatus 100, or the like.

In addition, a memory 220 is connected to the controller 200, wherein the memory 220 stores programs for implementing various processes executed by the plasma processing apparatus 100 under control of the controller 200 or recipe data or the like necessary for executing the programs.

The memory 220 stores, for example, a plurality of process processing recipes for executing processes on the wafer W as well as recipes or the like for performing necessary processes such as a cleaning process in the processing chamber 102. The recipe is data representing a plurality of parameter values such as control parameters for controlling each unit of the plasma processing apparatus 100 and setting parameters. For example, the process processing recipe has, for example, parameter values such as a flow rate of a processing gas, a pressure inside the processing chamber, and high-frequency power.

In addition, the recipe may be stored in a hard disk or a semiconductor memory or may be set at a predetermined position of the memory 220 in a state of being accommodated in a storage medium readable by a portable computer, such as a compact disc read-only memory (CD-ROM) or a digital versatile disk (DVD).

The controller 200 controls each unit by retrieving a desired process processing recipe from the memory 220 based on an instruction or the like from the operation unit 210, thereby performing a desired process in the plasma processing apparatus 100. In addition, the controller 200 may edit a recipe according to an operation from the operation unit 210.

(Configuration of First Electromagnet Group)

Figure 2:
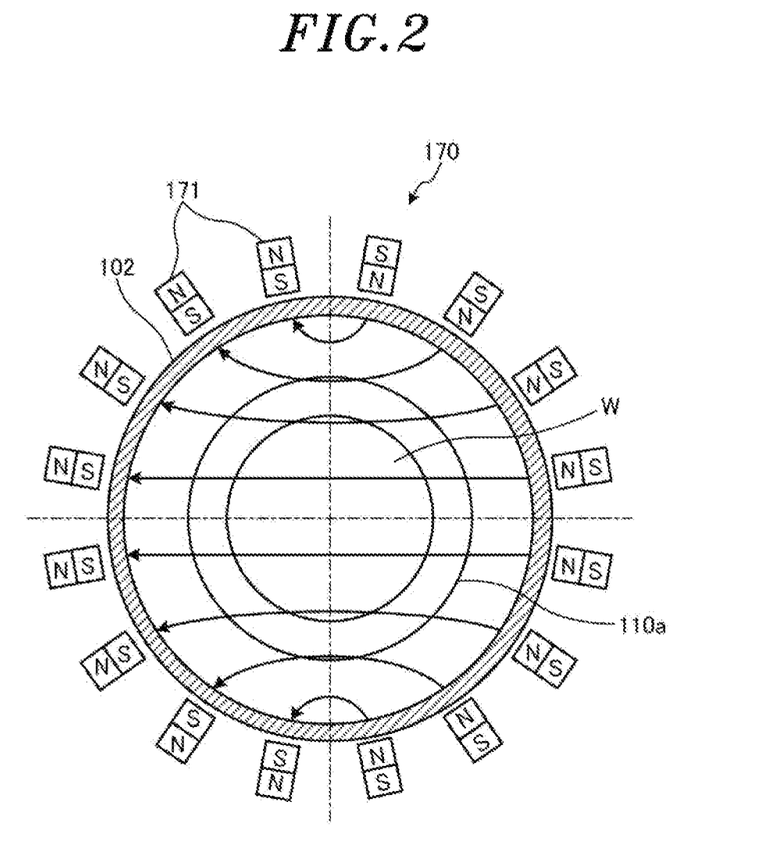
FIG. 2 is a schematic horizontal cross-sectional view illustrating a first electromagnet group according to the present embodiment.

Next, the configuration of the first electromagnet group 170 will be described with reference to FIG. 2. FIG. 2 is a schematic horizontal cross-sectional view illustrating the first electromagnet group 170 according to the present embodiment. A cross section shown in FIG. 2 corresponds to a horizontal cross section of the mounting table 110 in the processing chamber 102 when viewed from above. FIG. 2 illustrates the mounting surface 110a of the mounting table 110 in a disk shape and illustrates the wafer W mounted on the mounting surface 110a of the mounting table 110. The first electromagnet group 170 is provided at a position higher than the mounting surface 110a of the mounting table 110 on the outer perimeter of the processing chamber 102.

The first electromagnet group 170 is provided by arranging a plurality of electromagnets 171 in a concentric shape (ring shape) around the central axis of the processing chamber 102 and the mounting table 110. In the example of FIG. 2, 16 electromagnets 171 are disposed in a ring shape. The electromagnets 171 disposed in two zones divided in a circumferential direction of the first electromagnet group 170 have different magnetic pole orientations. That is, the magnetic pole of each electromagnet 171 is set such that the magnetic pole orientation of the electromagnet 171 disposed in one zone of the two zones divided in the circumferential direction of the first electromagnet group 170 is opposite to the magnetic pole orientation of the electromagnet 171 disposed in the other zone thereof. In the example of FIG. 2, there are a left zone and a right zone divided in the circumferential direction of the first electromagnet group 170, and the magnetic pole orientations of eight electromagnets 171 disposed in the left zone is opposite to the magnetic pole orientations of eight electromagnets 171 disposed in the right zone. The first electromagnet group 170 forms a magnetic field traversing the processing chamber 102 above the mounting surface 110a of the mounting table 110 based on a magnetic pole of each electromagnet 171 set as shown in FIG. 2. The magnetic field formed by the first electromagnet group 170 will be referred to as a "first magnetic field" below.

In the plasma processing apparatus 100, in a state in which plasma is generated in the processing chamber 102 due to an induced electric field from the antenna element 142, the first magnetic field is formed by the first electromagnet group. The first magnetic field is a horizontal magnetic field that traverses the plasma generated in the processing chamber 102. When the first magnetic field is formed in the processing chamber 102, electrons in plasma reciprocate along magnetic flux lines, wound by magnetic force lines of the first magnetic field that is a horizontal magnetic field. In addition, since a Larmor radius decreases as a magnetic flux density becomes higher, an electron density becomes higher at the height position of a magnet where a magnetic flux density is high, and an electron density becomes lower as it gets away therefrom (above and below the center of the magnet). Furthermore, since cations in plasma may be attracted toward electrons in order to maintain electric neutrality, the density of the cations in a height direction is also the highest at the height of the center of the magnet. The first magnetic field traverses the plasma generated in the processing chamber 102 to capture ions (for example, cations) in the plasma positioned above the mounting surface 110a of the mounting table 110. As a result, the amount of ions reaching the wafer W is suppressed at both a central portion and an edge portion of the wafer W on the mounting surface 110a of the mounting table 110. Meanwhile, electrically neutral radicals in plasma pass through the first magnetic field and descend toward the wafer W on the mounting surface 110a of the mounting table 110.

(Configurations of Second Electromagnet Group and Third Electromagnet Group)

Figure 3:
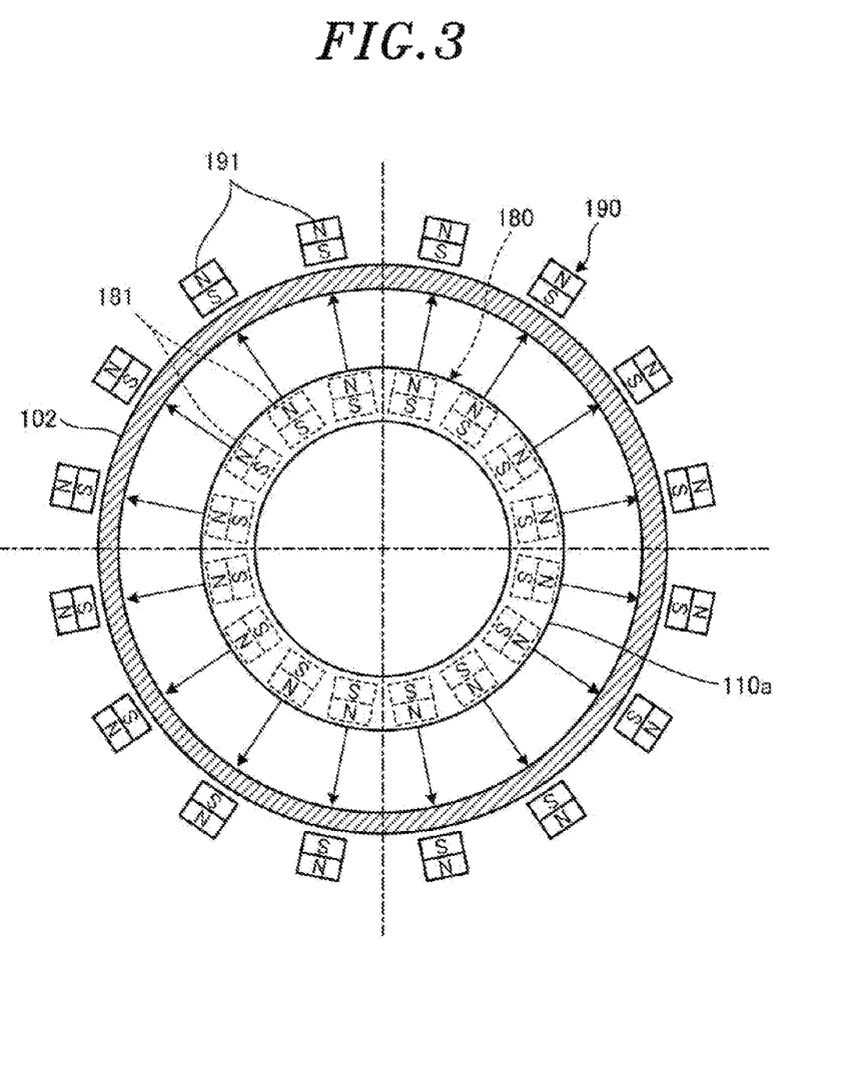
FIG. 3 is a schematic horizontal cross-sectional view illustrating a second electromagnet group and a third electromagnet group according to the present embodiment.

Next, the configurations of the second electromagnet group 180 and the third electromagnet group 190 will be described with reference to FIG. 3. FIG. 3 is a schematic horizontal cross-sectional view illustrating the second electromagnet group 180 and the third electromagnet group 190 according to the present embodiment. A cross section shown in FIG. 3 corresponds to the horizontal cross section of the mounting table 110 in the processing chamber 102 when viewed from above. FIG. 3 illustrates the mounting surface 110a of the mounting table 110 in a disk shape and illustrates the wafer W mounted on the mounting surface 110a of the mounting table 110. The second electromagnet group 180 is provided inside the mounting table 110 along the outer perimeter of the mounting table 110. The third electromagnet group 190 is provided at the same height position as that of the second electromagnet group 180 on the outer perimeter of the processing chamber 102.

The second electromagnet group 180 is provided by arranging a plurality of electromagnets 181 in a concentric shape (ring shape) around the central axis of the processing chamber 102 and the mounting table 110. In the example of FIG. 3, 16 electromagnets 181 are disposed in a ring shape.

The third electromagnet group 190 is provided by arranging a plurality of electromagnets 191 in a concentric shape (ring shape) around the central axis of the processing chamber 102 and the mounting table 110. In the example of FIG. 3, 16 electromagnets 191 are disposed in a ring shape so as to correspond one-to-one to 16 electromagnets 181. The magnetic pole orientation of the third electromagnet group 190 is different from the magnetic pole orientation of the second electromagnet group 180. That is, the magnetic pole of each electromagnet 191 and the magnetic pole of each electromagnet 181 are set such that the magnetic pole orientations of all the electromagnets 191 are opposite to the magnetic pole orientations of all the electromagnets 181. In the example of FIG. 3, the magnetic pole orientations of electromagnets 191 are opposite to the magnetic pole orientations of 16 electromagnets 181. The third electromagnet group 190 and the second electromagnet group 180 form a magnetic field radially extending in a radial direction from a side surface of the mounting table 110 around the mounting surface 110a of the mounting table 110 based on the magnetic pole of each electromagnet 191 and the magnetic pole of each electromagnet 181 set as shown in FIG. 3. The magnetic field formed by the third electromagnet group 190 and the second electromagnet group 180, which radially extends in the radial direction, will be referred to as a "second magnetic field" below.

In the plasma processing apparatus 100, in a state in which plasma is generated in the processing chamber 102 due to an induced electric field introduced from the antenna element 142, the first magnetic field is formed by the first electromagnet group, and the second magnetic field is formed by the third electromagnet group 190 and the second electromagnet group 180. The first magnetic field is a horizontal magnetic field that traverses the plasma generated in the processing chamber 102, and the second magnetic field is a horizontal magnetic field that is formed around the mounting surface 110a of the mounting table 110. When the first magnetic field and the second magnetic field are formed in the processing chamber 102, electrons in plasma reciprocate along magnetic flux lines, wound by magnetic force lines of each of the first magnetic field and the second magnetic field that are horizontal magnetic fields. In addition, since a Larmor radius decreases as a magnetic flux density becomes higher, an electron density becomes higher at a height of a magnet where a magnetic flux density is high, and an electron density becomes lower as it gets away therefrom (above and below a center of the magnet). Furthermore, since cations in plasma may be attracted toward electrons in order to maintain electric neutrality, the density of the cations in a height direction is also the highest at the height position of the center of the magnet. The first magnetic field traverses the plasma generated in the processing chamber 102 to capture ions (for example, cations) in the plasma positioned above the mounting surface 110a of the mounting table 110. Most ions (for example, cations) in the plasma are captured by the first magnetic field. However, other ions in the plasma descend toward the wafer W on the mounting surface 110a of the mounting table 110 without being captured by the first magnetic field. The second magnetic field captures ions, which descend without being captured by the first magnetic field, around the mounting surface 110a of the mounting table 110. As a result, while an ion density is maintained at a portion near a central portion of the wafer W on the mounting surface 110a of the mounting table 110, only an ion density near an edge portion of the wafer W is increased. Meanwhile, electrically neutral radicals in plasma descend toward the wafer W without receiving forces from the first magnetic field and the second magnetic field. As a result, a ratio of ions to radicals at each of the central portion and the edge portion of the wafer W can be controlled independently.

Figure 4A:
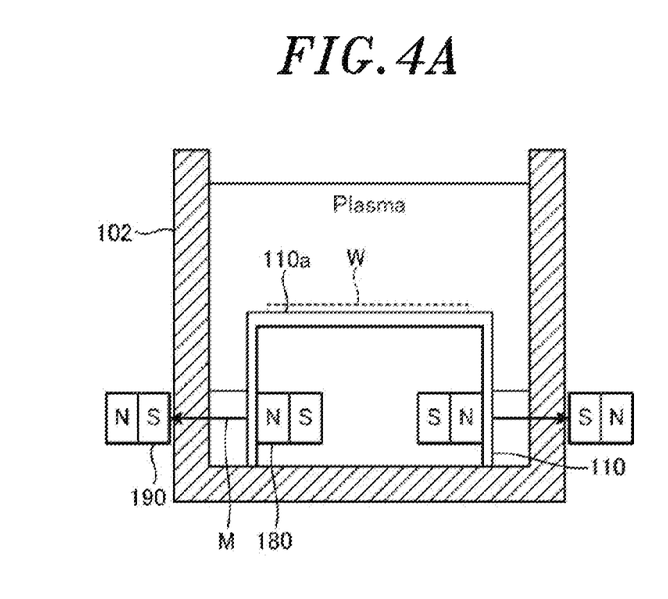
FIGS. 4A and 4B are views for describing the movement of the third electromagnet group according to the present embodiment.
Figure 4B:
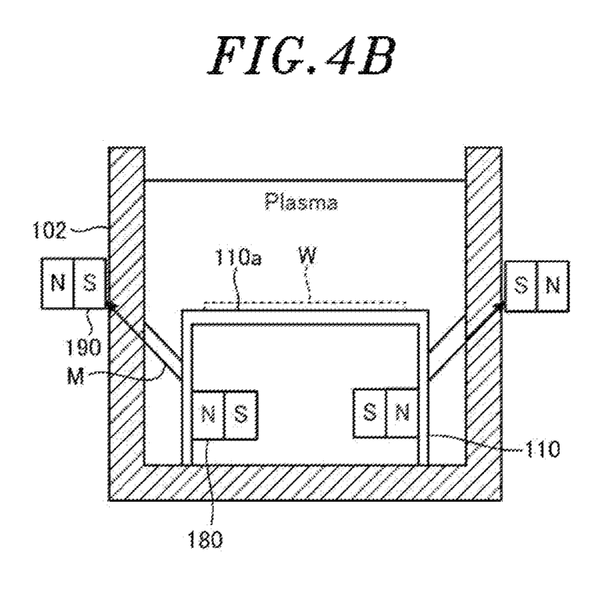

In addition, the third electromagnet group 190 may be provided to vertically move along the outer perimeter of the processing chamber 102. The movement of the third electromagnet group 190 is realized by a movement mechanism (not shown). FIGS. 4A and 4B are views for describing the movement of the third electromagnet group 190 according to the present embodiment. FIG. 4A illustrates a state in which the third electromagnet group 190 is positioned at the same height position as that of the second electromagnet group 180. In a state in which plasma is generated in the processing chamber 102 due to an induced electric field introduced from the antenna element 142, a second magnetic field M is generated around the mounting surface 110a of the mounting table 110 by the third electromagnet group 190 and the second electromagnet group 180. The third electromagnet group 190 moves upward along the outer perimeter of the processing chamber 102 from the same height position as that of the second electromagnet group 180. FIG. 4B shows a state after the third electromagnet group 190 has moved. Due to the third electromagnet group 190 moving to a height position higher than that of the second electromagnet group 180 along the outer perimeter of the processing chamber 102, the second magnetic field M is inclined in a direction toward an outer edge of the mounting surface 110a in an entire circumference around the mounting surface 110a of the mounting table 110. Thus, plasma is confined on the mounting surface 110a of the mounting table 110. This promotes an increase in ion density near the edge portion of the wafer W. As a result, the controllability of a ratio of ions to radicals at the edge portion of the wafer W can be improved.

Effects

As described above, the plasma processing apparatus 100 according to the present embodiment includes the processing chamber 102, the dielectric 104, the high-frequency antenna 140, the first electromagnet group 170, the second electromagnet group 180, and the third electromagnet group 190. The mounting table 110 having the mounting surface 110a, on which the wafer W is mounted, is provided inside the processing chamber 102, and a plasma process is performed on the wafer W. The dielectric 104 has the facing surface 104a facing the mounting surface 110a of the mounting table 110. The high-frequency antenna 140 is provided on the surface 104b opposite to the facing surface 104a of the dielectric 104 and introduces an induced electric field into the processing chamber 102 through the dielectric 104, and thus, plasma is generated. The first electromagnet group 170 is provided at a position higher than the mounting surface 110a of the mounting table 110 on the outer perimeter of the processing chamber 102 and forms the first magnetic field that traverses the processing chamber 102 above the mounting surface 110a of the mounting table 110. The second electromagnet group 180 is provided inside the mounting table 110 along the outer perimeter of the mounting table 110. The third electromagnet group 190 is provided at a position corresponding to the second electromagnet group 180 on the outer perimeter of the processing chamber 102 and cooperates with the second electromagnet group 180 to form the second magnetic field around the mounting surface 110a of the mounting table 110. Therefore, the plasma processing apparatus 100 can independently control a ratio of ions to radicals at each of the central portion and the edge portion of the object to be processed (for example, the wafer W).

Furthermore, the magnetic pole orientation of the third electromagnet group 190 may be different from the magnetic pole orientation of the second electromagnet group 180. As a result, the plasma processing apparatus 100 can form the second magnetic field capable of capturing ions around the mounting surface 110a of the mounting table 110 based on a magnetic pole of each electromagnet of the third electromagnet group 190 and a magnetic pole of each electromagnet of the second electromagnet group 180.

In addition, the third electromagnet group 190 may be provided at a height position that is the same as or higher than that of the second electromagnet group 180 on the outer perimeter of the processing chamber 102. As a result, the plasma processing apparatus 100 can efficiently form the second magnetic field capable of capturing ions around the mounting surface 110a of the mounting table 110.

In addition, the third electromagnet group 190 may be provided to vertically move along the outer perimeter of the processing chamber 102. Therefore, the plasma processing apparatus 100 can improve the controllability of a ratio of ions to radicals at the edge portion of the object to be processed (for example, the wafer W).

Modified Embodiment

Figure 5:
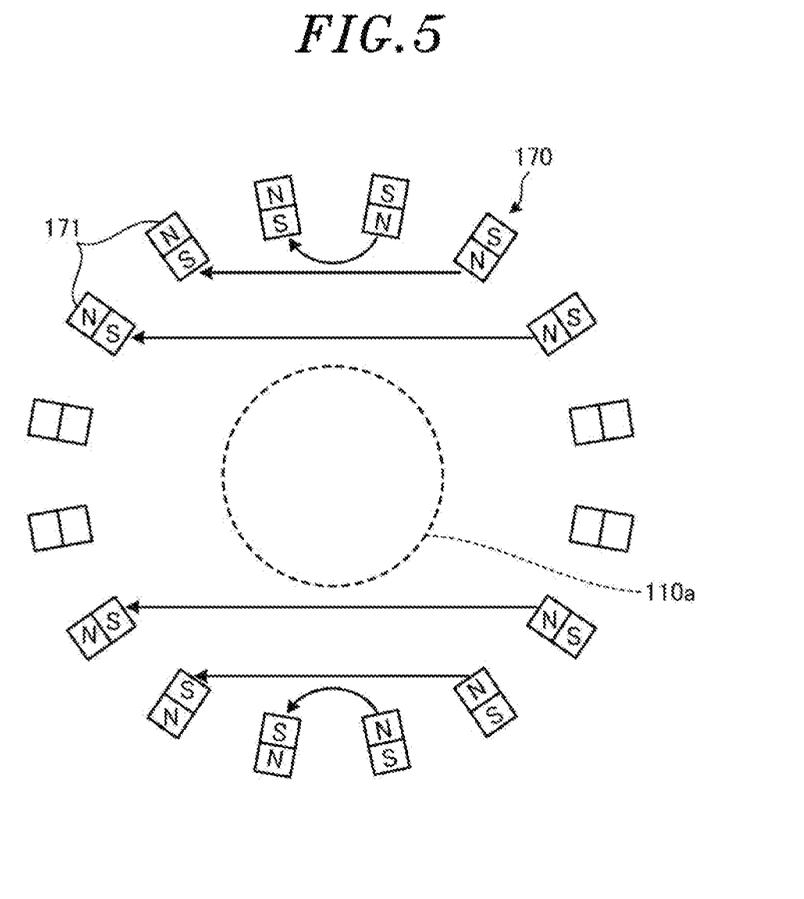
FIG. 5 is a view illustrating an example of a first magnetic field formed for each area.
Figure 6:
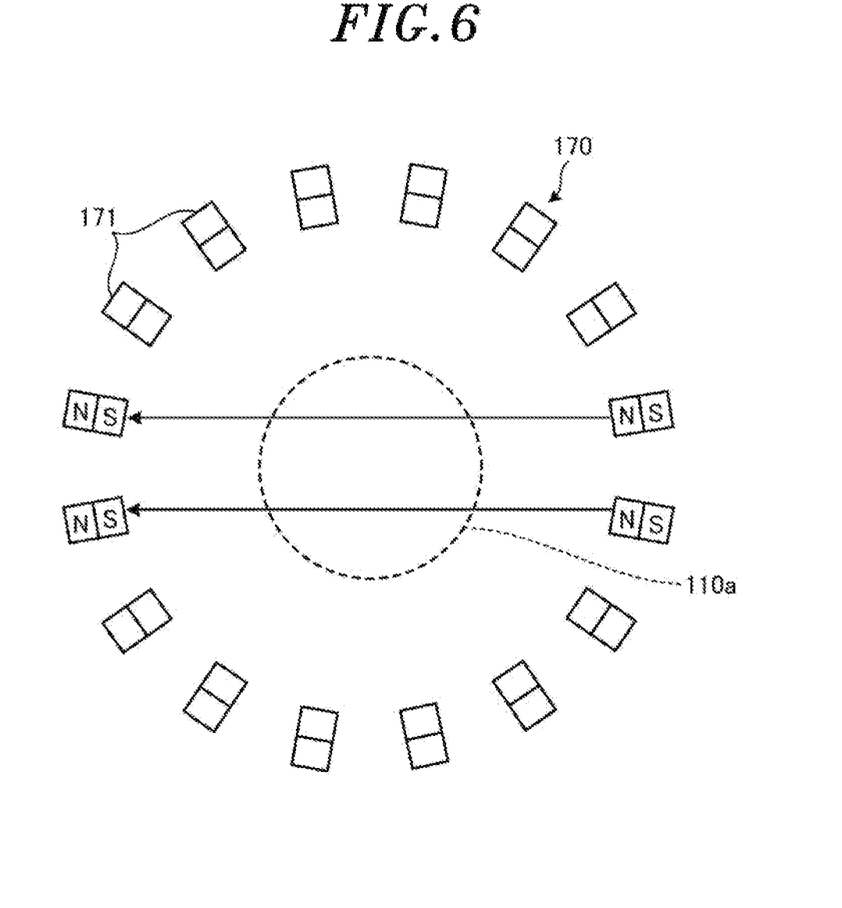
FIG. 6 is a view illustrating another example of the first magnetic field formed for each area.

In the above-described embodiment, an example case in which the first magnetic field is formed in an entire area above the mounting surface 110a of the mounting table 110 by the first electromagnet group 170 has been described, but the disclosed technology is not limited thereto. For example, by selectively turning on/off each electromagnet 171 of the first electromagnet group 170, the first electromagnet group 170 may form above the mounting surface 110a of the mounting table 110, an area in which the first magnetic field is formed and an area in which the first magnetic field is not formed. Each electromagnet 171 of the first electromagnet group 170 is turned on/off under the control of the controller 200. FIG. 5 is a view illustrating an example of the first magnetic field formed for each area. For example, the first electromagnet group 170 forms the first magnetic field only in an area near the outer edge of the mounting surface 110a by turning four electromagnets 171 off and turning other electromagnets 171 on, wherein the four electromagnets 171 are disposed with the mounting surface 110a of the mounting table 110 interposed therebetween. Then, the first magnetic field captures ions in plasma corresponding to the area near the outer edge of the mounting surface 110a. As a result, near the edge portion of the wafer W on the mounting surface 110a of the mounting table 110, the amount of ions is locally suppressed. FIG. 6 is a view illustrating another example of the first magnetic field formed for each area. For example, the first electromagnet group 170 forms the first magnetic field only in an area near a central portion of the mounting surface 110a by turning four electromagnets 171 on and turning other electromagnets 171 off, wherein the four electromagnets 171 are disposed with the mounting surface 110a of the mounting table 110 interposed therebetween. Then, the first magnetic field captures ions in plasma corresponding to the area near the central portion of the mounting surface 110a. As a result, near the central portion of the wafer W on the mounting surface 110a of the mounting table 110, an amount of ions is locally suppressed.

Figure 7:
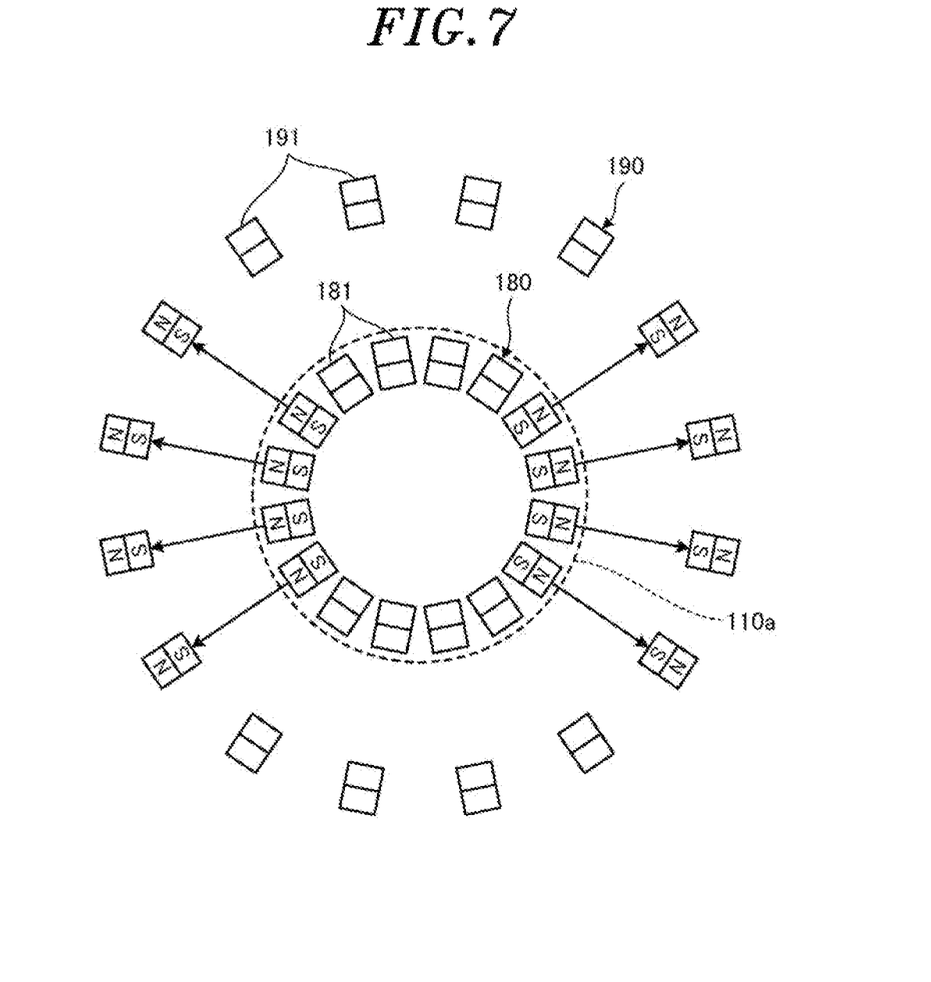
FIG. 7 is a view illustrating an example of a second magnetic field formed for each area.

In addition, in the above-described embodiment, an example case in which the second electromagnetic field is formed in an entire area around the mounting surface 110a of the mounting table 110 by the second electromagnet group 180 and the third electromagnet group 190 has been described, but the disclosed technology is not limited thereto. For example, by selectively turning each electromagnet 181 and each electromagnet 191 on/off, the second electromagnet group 180 and the third electromagnet group 190 may form around the mounting surface 110a of the mounting table 110, an area in which the second magnetic field is formed and an area in which the second magnetic field is not formed. Each electromagnet 181 and each electromagnet 191 of the second electromagnet group 180 and the third electromagnet group 190 are turned on/off under the control of the controller 200. FIG. 7 is a view illustrating an example of the second magnetic field formed for each area. For example, the second electromagnet group 180 and the third electromagnet group 190 form the second magnetic field in an area, in which 16 electromagnets 181 and 191 are disposed with the mounting surface 110a of the mounting table 110 interposed therebetween, by turning the 16 electromagnets 181 and 191 off and other electromagnets on. The second magnetic field captures ions in plasma corresponding to the area in which the 16 electromagnets 181 and 191 are disposed with the mounting surface 110a interposed therebetween. As a result, near the edge portion of the wafer W on the mounting surface 110a of the mounting table 110, the amount of ions is locally suppressed.

In addition, in the above-described embodiment, magnetic fields (that is, the first magnetic field or the second magnetic field) formed by the first electromagnet group 170, the second electromagnet group 180, and the third electromagnet group 190 may be rotated about the central axis of the processing chamber 102. As a result, the distribution of an ion density in a circumferential direction of the processing chamber 102 can be made uniform. The rotation of a magnetic field may be realized using a rotation mechanism (not shown). In addition, a magnetic field may be rotated by changing the magnetic pole of each electromagnet of the first electromagnet group 170, each electromagnet of the second electromagnet group 180, and each electromagnet of the third electromagnet group 190.

While the embodiments have been described, it is to be understood that the embodiments disclosed herein are illustrative in all respects and are not limitative. Indeed, the above-described embodiments can be embodied in various forms. Moreover, various omissions, substitutions and changes in the form of the embodiment described herein may be made without departing from the scope and the purport of claims.

The invention claimed is:

1. A plasma processing apparatus comprising:
a processing chamber including a mounting table having a mounting surface, wherein an object to be processed is mounted on the mounting surface and a plasma process is performed on the object to be processed in the processing chamber;
a dielectric which has a surface facing the mounting surface of the mounting table;
an antenna which is provided on a surface opposite to the facing surface of the dielectric and introduces an induced electric field into the mounting table through the dielectric to form plasma;
a first electromagnet group which is provided at a position higher than the mounting surface of the mounting table on an outer perimeter of the processing chamber and forms a first magnetic field that traverses the processing chamber above the mounting surface of the mounting table;
a second electromagnet group provided inside the mounting table along an outer perimeter of the mounting table;
a third electromagnet group which is provided at a position corresponding to the second electromagnet group on the outer perimeter of the processing chamber and cooperates with the second electromagnet group to form a second magnetic field around the mounting surface of the mounting table;
a memory that stores programs; and
a control circuit configured, with the programs stored in the memory, to control each of electromagnets of the first electromagnet group, the second electromagnet group, and the third electromagnet group to selectively turn on and off, wherein
the control circuit is configured, with the programs stored in the memory, to control each of the electromagnets of the first electromagnet group to form a first area and a second area above the mounting surface, the first area having the first magnetic field and the second area not having the first magnetic field,
the control circuit is configured, with the programs stored in the memory, to control each of the electromagnets of the second electromagnet group and the third electromagnet group to form a third area and a fourth area around the mounting surface, the third area having the second magnetic field and the fourth area not having the second magnetic field, and
the control circuit is configured, with the programs stored in the memory, to control each of the electromagnets of the first electromagnet group, the second electromagnet group, and the third electromagnet group to selectively turn on and off, such that the third area overlaps with the second area from a top view of the mounting surface.

2. The plasma processing apparatus of claim 1, wherein a magnetic pole orientation of the third electromagnet group is different from a magnetic pole orientation of the second electromagnet group.

3. The plasma processing apparatus of claim 2, wherein the third electromagnet group is provided at a height position that is the same as or higher than a height position of the second electromagnet group on the outer perimeter of the processing chamber.

4. The plasma processing apparatus of claim 1, wherein the control circuit is configured to control the third electromagnet group to move vertically along the outer perimeter of the processing chamber.

5. The plasma processing apparatus of claim 2, wherein the control circuit is configured to control the third electromagnet group to move vertically along the outer perimeter of the processing chamber.

6. The plasma processing apparatus of claim 3, wherein the control circuit is configured to control the third electromagnet group to move vertically along the outer perimeter of the processing chamber.

7. The plasma processing apparatus of claim 1, wherein the control circuit is configured to control magnetic fields formed by the first electromagnet group, the second electromagnet group, and the third electromagnet group to be rotated about a central axis of the processing chamber.

8. The plasma processing apparatus of claim 2, wherein the control circuit is configured to control magnetic fields formed by the first electromagnet group, the second electromagnet group, and the third electromagnet group to be rotated about a central axis of the processing chamber.

9. The plasma processing apparatus of claim 3, wherein the control circuit is configured to control magnetic fields formed by the first electromagnet group, the second electromagnet group, and the third electromagnet group to be rotated about a central axis of the processing chamber.

10. The plasma processing apparatus of claim 1, wherein the control circuit is configured, with the programs stored in the memory, to control each of electromagnets of the second electromagnet group and each of electromagnets of the third electromagnet group to selectively turn on and off to form a third area and a fourth area around the mounting surface, wherein the third area has the second magnetic field and the fourth area does not have the second magnetic field.

11. The plasma processing apparatus of claim 2, wherein the control circuit is configured, with the programs stored in the memory, to control each of electromagnets of the second electromagnet group and each of electromagnets of the third electromagnet group to selectively turn on and off to form a third area and a fourth area around the mounting surface, wherein the third area has the second magnetic field and the fourth area does not have the second magnetic field.

12. The plasma processing apparatus of claim 3, wherein the control circuit is configured, with the programs stored in the memory, to control each of electromagnets of the second electromagnet group and each of electromagnets of the third electromagnet group to selectively turn on and off to form a third area and a fourth area around the mounting surface, wherein the third area has the second magnetic field and the fourth area does not have the second magnetic field.

13. The plasma processing apparatus of claim 1, wherein the control circuit is configured, with the programs stored in the memory, to cause the plasma processing apparatus to form the second magnetic field radially extending in a radial direction from a side surface of the mounting table.

14. The plasma processing apparatus of claim 10, wherein the control circuit is configured, with the programs stored in the memory, to cause the plasma processing apparatus to form the second magnetic field radially extending in a radial direction from a side surface of the mounting table.

15. The plasma processing apparatus of claim 1, wherein
the first area is an area outside an outer edge of the mounting surface from a top view of the mounting surface, and the second area includes an area inside the outer edge of the mounting surface from the top view of the mounting surface, and
at least two of the electromagnets of the first electromagnet group that are turned off are disposed with the mounting surface interposed therebetween.

16. The plasma processing apparatus of claim 15, wherein
the control circuit is configured, with the programs stored in the memory, to control each of the electromagnets of the first electromagnet group to selectively turn on and off to form a second mode where the third area and the fourth area above the mounting surface are formed, wherein
the third area has the first magnetic field and the fourth area does not have the first magnetic field,
the fourth area is an area outside an outer edge of the mounting surface from a top view of the mounting surface, and the third area includes an area inside the outer edge of the mounting surface from the top view of the mounting surface, and
at least two of the electromagnets of the first electromagnet group that are turned on are disposed with the mounting surface interposed therebetween.

* * * * *